July 7, 1964

J. S. MURRAY

TRANSISTOR AMPLIFIER HAVING DIRECT CURRENT FEEDBACK BIAS CONTROL 3,140,448

Filed Jan. 13, 1960

2 Sheets-Sheet 1

July 7, 1964 J. S. MURRAY 3,140,448

TRANSISTOR AMPLIFIER HAVING DIRECT CURRENT FEEDBACK BIAS CONTROL

Filed Jan. 13, 1960

2 Sheets-Sheet 2

3,140,448

TRANSISTOR AMPLIFIER HAVING DIRECT CURRENT FEEDBACK BIAS CONTROL

John Somerset Murray, 7 Ranulf Road, London NW. 2, England

Filed Jan. 13, 1960, Ser. No. 2,148
Claims priority, application Great Britain Jan. 13, 1959
1 Claim. (Cl. 330—19)

Figure 1:
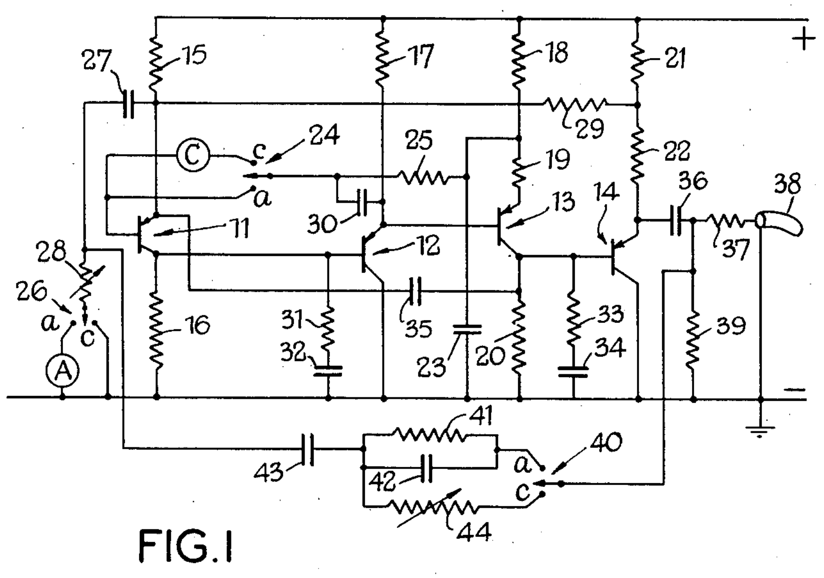

The present invention relates to transistor amplifiers.

It is known, as for example from my British Patent No. 809,207, to provide, for determining the base-collector bias of the transistor in a voltage-amplifying stage of an amplifier, a direct-current conductive bias loop which extends from the collector to the base of the transistor to be biassed via the base-emitter path of a second transistor which is included in an emitter-follower stage, the base of the second transistor being connected directly to the collector of the transistor to be biassed and the emitter of the second transistor being connected back, through a resistance, to the base of the transistor to be biassed.

It is an object of the invention to provide a multi-stage transistor amplifier which comprises at least two voltage-amplifying stages and in which the base-collector bias of each transistor contained in a voltage-amplifying stage of the amplifier is determined automatically by means which is insensitive to the inevitable variability of transistor characteristics due to temperature variation or as between one transistor and another which may, during the life of the amplifier, be inserted as a replacement therefor. This and other objects and advantages of the invention will be apparent from the detailed description which follows of various embodiments of an amplifier according to the invention.

One of the transistors is biassed in the known manner referred to above, and according to the invention at least one other transistor to be biassed is biassed by an equally simple, but novel, means.

According to the invention there is provided a transistor amplifier comprising two supply-voltage terminals, first, second, third and fourth transistors, the bases of the third and fourth transistors being connected D.C.-conductively to the emitter of the second transistor and the collector of the third transistor respectively and the base of the second transistor being connected D.C.-conductively to the collector of the first transistor, the emitters of all four transistors being connected through respective emitter resistors each to the appropriate supply-voltage terminal and the collectors of the first and third transistors being connected through respective collector load resistors, and the collectors of the second and fourth transistors directly, each to the appropriate supply-voltage terminal, and either the emitter or the base of the first transistor being connected to a signal input terminal, wherein there is provided, for determination of the base-collector voltage bias of the first transistor, a first D.C.-conductive connection between the base of the first transistor and the emitter of either the second or the third transistor, and there is further provided, for determination of the base-collector bias of the third transistor, either a second D.C.-conductive, connection between the emitter of the first transistor and a point on the emitter resistance of the fourth transistor such that the second D.C.-conductive connection is connected between two points at equal potential, or the second D.C.-conductive connection and the emitter resistances of the first and fourth transistors are replaced by an equivalent resistive network.

In certain embodiments of the invention, the said signal input terminal for the first transistor is connected to the base thereof and the said base is thereby connected to the emitter of a preceding stage transistor of the amplifier, the collector and the emitter of this preceding stage transistor being connected to the appropriate voltage terminals directly and, respectively, through an emitter resistor, and the said first D.C.-conductive connection including the base-emitter path of the said preceding-stage transistor, the base thereof being connected to the emitter of the said second or said third transistor.

Figure 2:
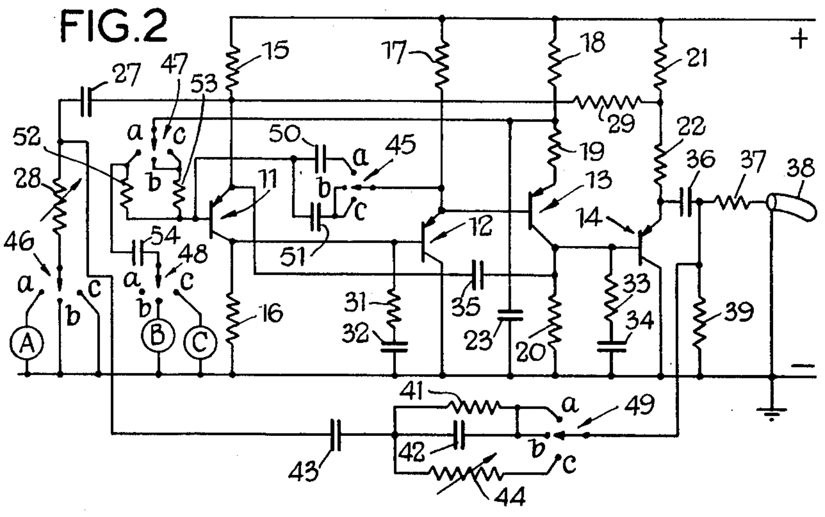
Figure 3:
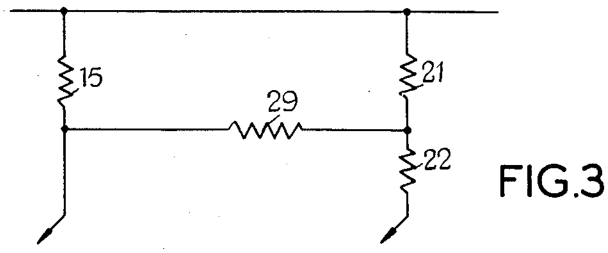
Figure 4:
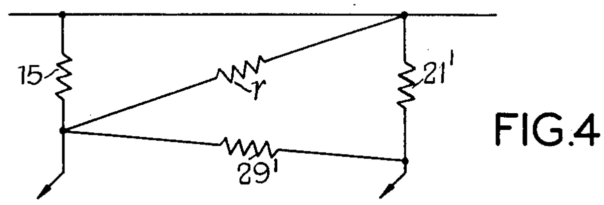
Figure 5:
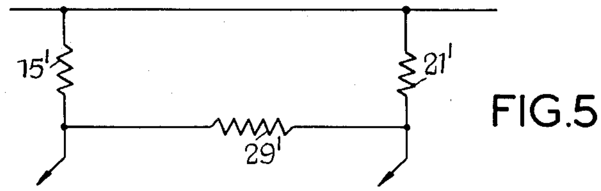
Figure 6:
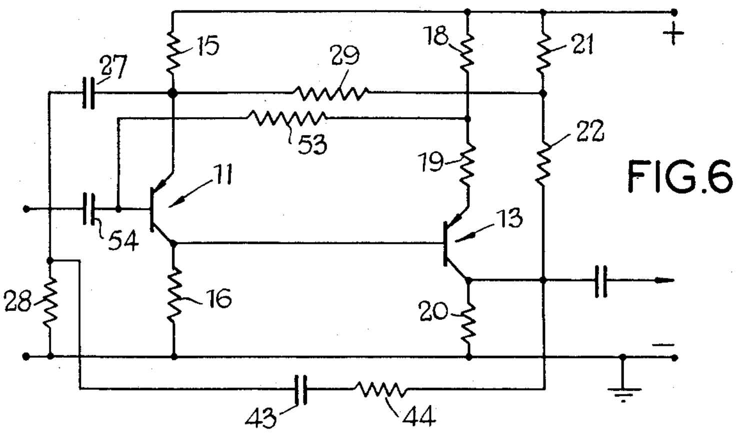

Various embodiments of an amplifier according to the invention are illustrated in the accompanying drawings, in which:

FIGURE 1 shows a four-stage transistor amplifier of which two stages are voltage-amplifying stages, and which includes switching means by which the amplifier is adapted to amplify signals from either a moving-coil gramophone pick-up head or a tape-recorder playback head; and FIGURE 2 shows a four-stage transistor amplifier of which two stages are voltage-amplifying stages, and which includes switching means by which the amplifier is adapted to amplify signals from a moving-coil gramophone pick-up head or a variable-reluctance gramophone pick-up head or a tape-recorder head, FIGURES 3, 4 and 5 show how the circuits of FIGURES 1 and 2 may be modified, and FIGURE 6 shows a further, simplified, embodiment of the invention.

The basic circuit, which is common to the amplifiers in FIGURES 1 and 2 of which the circuit elements are therefore similarly referenced in the two figures, will be described first.

The four stages of the amplifier includes, respectively, transistors 11, 12, 13 and 14. The transistor 11, in a first, voltage-amplifying stage, is provided with an emitter resistor 15 and a collector-load resistor 16, and its collector is connected directly to the base of the transistor 12, which is in a second, emitter-follower stage, having an emitter resistor 17 and a direct connection between its collector and the grounded negative supply-voltage line. The emitter of the transistor 12 is connected directly to the base of the transistor 13, which, having an emitter resistance, comprised by the resistors 18 and 19 in series, and a collector resistor 20, is in a second voltage-amplifying stage, the third stage of the amplifier. The fourth stage of the amplifier is a second emitter-follower stage, its transistor 14, of which the base is connected directly to the collector of the transistor 13, having emitter resistance constituted by resistors 21 and 22 in series and having its collector connected directly to the grounded negative supply-voltage line. The resistor 18 is decoupled, so that the emitter of the transistor 13 is partially decoupled by a condenser 23; and either the base or the emitter (depending on the position of switch means to be described below) of the transistor 11 is also decoupled except for the provision of signal feedback components.

In FIGURE 1, there is shown a switch 24 having two positions *a* and *c*, and in the position *a* of this switch the junction of the resistors 18 and 19 is connected back through a resistor 25 to the base of the transistor 11, which, since the resistor 25 is of fairly small value, is decoupled through the condenser 23. A switch 26, ganged with the switch 24 and having corresponding *a* and *c* positions, in its *a* position connects the emitter of the transistor 11, through a condenser 27 and an adjustable resistor 28 in series therewith, to an input terminal for a moving-coil pick-up which is indicated A. In the *a* position of the switches, therefore, input signals are applied to the emitter of the transistor 11.

The desired base-collector bias-voltage for the transistor 11 is developed, in the known manner described in my specification above referred to, as the sum of the (substantially constant) base-emitter voltages of the transistors 12 and 13 and the potential drops across the resistors 19 and 25. The base-collector bias of the transistor 13, in the second voltage-amplifying stage of the amplifier, remains to be determined with accuracy by other means.

The potential of the base of the transistor 13 is substantially already determined, once the base-collector bias of the transistor 11 has been established in the manner described above. However, variation of the standing collector current in the transistor 13, due for example to temperature variation, would alter the base-collector bias of the transistor 13 in the absence of means to prevent such alteration.

In accordance with the invention, the means provided is a resistor 29 which is connected between the emitter of the transistor 11 and the junction of the resistors 21 and 22, these two resistors being so chosen that in the absence of any unwanted current variation the D.C. potential at their junction is substantially that of the emitter of the transistor 11, so that the resistor 29 carries no current. If, now, due to temperature variation of the transistor 13, or because the transistor 13 has a higher collector leakage current than was contemplated when the values of the resistors 18, 19 and 20 were chosen, the collector current of the transistor 13 is too high, so that the potential of the collector of the transistor 13 is also too high and, in the absence of precautions, the base-collector bias of the transistor 13 would be too low and would tend to clip signals applied to the base; the base of the transistor 14, and correspondingly its emitter, is also at a higher potential than contemplated. The junction of the resistors 21, 22 and 29 is therefore also at a higher potential, and, since the emitter current of the transistor 11 is already determined and is substantially constant, this results in a reduction of current in the emitter resistance 15, so that the potential of the emitter of the transistor 11 also rises. The base-emitter voltage of the transistor 11 is substantially constant, and the base-collector bias has already been determined, as described above, at a constant value; therefore the potential of the collector of the transistor 11 rises by the same amount as the potential of the emitter. The base and emitter of the transistor 12 follow this rise, and therefore the potential of the base of the transistor 13 is also raised. The net effect of a rise in the potential of the collector of the transistor 13 is thus to raise the base potential, and it may easily be arranged that the difference between these two variations is very small, i.e. that a change of collector leakage current does not substantially alter the base-collector bias of the transistor 13. This is equally true of a decrease in the collector leakage current, and the equal change in the potentials of all the electrodes of the transistor 11 is too small to affect the operation of the first stage of the amplifier. Thus the provision of the connection constituted by the resistor 29 is effective to determine and stabilize the base-collector bias of the transistor 13, once the base-collector bias of the transistor 11 has been separately determined as described.

The remainder of the circuit in FIGURE 1 will now be described. With the switches 24 and 26 in their *c* position, the emitter of the transistor 11 is decoupled through the condenser 27, apart from the presence of the small resistor 28, which functions as described below; and between the base of the transistor 11 and the resistor 25 there is connected the secondary winding C of a tape-recorder playback head transformer, which is thus included (allowably, since it is conductive to direct current) in the bias loop for the transistor 11. In this way, the bias means for the transistor 11 is so arranged that it does not constitute at the base of the transistor 11 a shunt for the tape-recorder head inductance which, at high frequencies, has a very high output impedance.

A condenser 30, connected between the emitter of the transistor 12 and the junction of the switch 24 and the resistor 25, provides an inner feedback loop, developing a feedback signal across the resistor 25, which increases the high-frequency stability of the amplifier.

High-frequency de-emphasis step circuits at the collectors of the transistors 11 and 12 are provided by a resistor 31 and a condenser 32 in series, and a resistor 33 and a condenser 34 in series, respectively. A condenser 35 connected between the collector of the transistor 13 and the emitter of the transistor 11 provides a short circuit at very high frequencies across the transistor 14 and a main overall feedback loop, referred to below, between the amplifier output and the emitter of the transistor 11. The amplified output signal is taken from the emitter of the transistor 14, through a condenser 36 and a resistor 37 which is shown connected to the center conductor of a coaxial cable 38 of which the outer conductor is grounded. The junction of the condenser 36 and resistor 37 is connected to ground through an output resistor 39, from the upper end of which a main overall negative feedback loop is taken back, through the condenser 27, to the emitter of the transistor 11. This feedback loop comprises, in the *a* position of a switch 40 which is ganged with the switches 24 and 26, a resistor 41 and condenser 42 in parallel, and a condenser 43 in series therewith, and provides negative feedback which is developed across the resistance 28 to give the required equalization of the amplifier gain characteristics. In the position *c* of the switch 40, the resistor 40 and condenser 41 in parallel are replaced by a variable resistor 44 which provides feedback to give the required bass-lift for characteristic equalization at different tape speeds.

A simple feedback mesh, such as that which includes the condenser 43, which is not D.C.-conductive, suffers from the disadvantage that the frequency at which bass-lift ceases to operate depends on the gain of the amplifier as is would be in the absence of that feedback mesh. The gramophone equalization characteristic (B.S. specification No. 1928) provides for a limit of the bass-lift at 50 c./s.; and unless steps are taken to ensure that this limit is observed in practical amplifiers, errors in the equalization characteristic can occur and will provide unwanted amplification of rumble or loss in the wanted bass response in high-or low-gain amplifiers respectively. The resistor 29, provided in the first place for D.C. biasing purposes, may be arranged to obviate such performance defects. To that end, the value of the resistor 29 is chosen, in conjunction with the components of the main overall feedback mesh, to limit the rise in bass response at a predetermined frequency. A residual amount of overall negative feedback is thereby applied at all frequencies below the predetermined bass-rise limit, and the resistor 29 thus serves both to provide D.C. bias stabilization of the base-collector voltage of the transistor 13 and simultaneously to define the lower end of the frequency response of the amplifier.

The circuit shown in FIGURE 2 is basically similar to that shown in FIGURE 1, and corresponding circuit elements, functioning in the manner already described with reference to FIGURE 1, are indicated by the same reference numerals 11 to 23, 27 to 29 and 31 to 44.

There are provided five ganged switches 45, 46, 47, 48 and 49, each having three positions *a*, *b* and *c* in which the amplifier is adapted to take its input signals from, respectively, a moving-coil gramophone pick-up head A, a variable-reluctance gramophone pick-up head B and a tape-recorder playback head either directly or through a head transformer with a secondary winding C. In the *a* position of the switch 45 a condenser 50, corresponding to the condenser 30 in FIGURE 1, is connected between the base and the emitter of transistors 11 and 12 respectively. In the *b* or *c* position of the switch 45, the condenser 50 is replaced by a condenser 51. In the *a* position of the switch 46, the moving-coil pick-up A is connected to the emitter of the transistor 11 through the condenser 27 and adjustable resistor 28 which, in the *b* or *c* position of the switch 46, decouple this emitter to ground and in all three cases provide for overall negative feedback to the emitter. In the *a* position of the switch 47, there is connected between the base of the transistor 11 and the junction of the resistors 18 and 19 a resistor 52 which corresponds to the resistor 25 in FIGURE 1 and which, in the *b* or *c* position of the switch 47, is replaced by a resistor 53. In the unconnected *a* position of the switch 48 the resistor 52 and a condenser 54 connected thereto are inoperative, but in the *b* or *c* position of the switch 48 the condenser 54 and resistor 52 serve as input condenser and input resistance connecting the variable-reluctance head B or the secondary winding C of the tape-recorder head transformer respectively, to the base of the transistor 11. Finally, the switch 49 (corresponding to the switch 40 in FIGURE 1), and whose *a* and *b* position the resistor 40 and condenser 41 are connected in parallel in the overall negative feedback loop, provides for the replacement of these two components, in its *c* position, by a variable resistor 44.

It will be noted that the two switch positions of the amplifier shown in FIGURE 1 provide two different embodiments of an amplifier according to the invention, and that the three switch positions of the amplifier shown in FIGURE 2 similarly provide three such different embodiments. In each embodiment, there is provided a direct-current conductive bias loop of known form by which the base-collector bias of the transistor 11 is determined, and in each embodiment there is further provided the additional means by which, according to the invention, the base-collector bias of the transistor 13 is also determined and, simultaneously, at least low-frequency overall signal feedback for the amplifier is provided. Further, it may be noted that, in the *a* switch position in both FIGURE 1 and FIGURE 2, the base of the transistor 11 and the tapping on the emitter resistance of the transistor 13 are enabled, because of the small resistance connected between them, to share common decoupling means, namely the condenser 23.

Very satisfactory amplifiers of the kinds illustrated in FIGURES 1 and 2, for operation from a 10.8 volts supply voltage, have the following components:

| | |
|---|---|
| Transistors: | |
| **11**—XA102 | **13**—XA102 |
| **12**—XB103 | **14**—XB103 |
| Resistors: | |
| **15**—18K ohms | **29**—22K ohms |
| **16**—27K ohms | **31**—1.5K ohms |
| **17**—15K ohms | **33**—330 ohms |
| **18**—5.6K ohms | **37**—680 ohms |
| **19**—330 ohms | **39**—820 ohms [2] |
| **20**—3.3K ohms | 10K ohms [3] |
| **21**—1.5K ohms | **41**—2.7K ohms |
| **22**—1.2K ohms | **44**—150 ohms [4] |
| **25**—1.2K ohms | **52**—1.2K ohms |
| **28**—220 ohms [1] | **53**—56K ohms |
| Condensers: | |
| **23**—500μf | **36**—4μf |
| **27**—500μf | **42**—.03μf |
| **30**—200pf | **43**—.09μf |
| **32**—1000pf | **50**—200pf |
| **34**—3000pf | **51**—22pf |
| **35**—470pf | **54**—1μf |

[1] Variable.
[2] Figure 1.
[3] Figure 2.
[4] To 5K ohms (variable).

It will be appreciated that if, as for some applications, it is desired to apply the input signals to the base of the transistor 11 through an emitter-follower preceding stage, the bias loop for determining the base-collector bias voltage of the transistor 11 may include the base-emitter path of the transistor of this preceding stage. In such case, it will be noted, the auxiliary D.C. connection, through the resistor 29, is still made to the emitter of the transistor 11.

Further, if it is desired to add a further voltage-amplifying stage, driven by the transistor 14 and itself driving a third emitter-follower stage, the base-collector bias of the transistor of the third voltage-amplifying stage may be determined, in similar manner to that of the transistor 13, by providing a D.C.-conductive connection between a tap on the emitter resistance of the third emitter-follower stage and the emitter of the transistor 13.

Although for reasons of maximum bandwidth it is desirable to include an emitter-follower stage as shown, including the transistor 12, it will be appreciated that if some loss of bandwidth can be tolerated in a particular case this second stage can be omitted without substantially affecting the bias conditions of the circuit, the collector of the transistor 11 being then connected directly to the base of the transistor 13.

Similarly, whether or not the second stage be omitted as described above, the fourth stage can also be omitted, if a certain loss of performance can be tolerated for the sake of inexpensiveness, in which case the resistance 22 is connected to the collector of the transistor 13 instead of to the emitter of the (omitted) transistor 14.

Accordingly, FIGURE 6 shows a circuit which is an embodiment of the invention but which differs from the circuits shown in FIGURES 1 and 2 in that both emitter-follower stages have been omitted and only the two voltage-amplifying stages are included. Components of the circuit shown in FIGURE 6 are indicated by the same reference numerals, as the corresponding components of FIGURES 1 and 2, and it will be noted, in particular that the determination and stabilisation of the biases of the transistors 11 and 13 in FIGURE 6 is achieved in essentially the same manner as for the corresponding transistors in FIGURES 1 and 2. It will be appreciated that in the FIGURE 6 arrangement the resistors 21 and 22 are normally of higher values than when employed in the circuits of FIGURES 1 and 2, in order to minimise the signal-shunting effect and extra current flow through the collector load resistance 20. The resistor 29, in addition to its biassing function, provides the same limiting influence on the bass rise of the amplifier characteristic as in the previously described circuits.

As may also be appreciated from a consideration of FIGURES 3, 4 and 5, the resistive network comprised by the resistors 15, 21, 22 and 29 may be replaced, within the scope of the invention and without altering the performance of circuit in any way, by a different, but equivalent, resistive network. In particular, FIGURES 3, 4 and 5 shows how the number of resistors employed may be reduced by one. Considering the resistors 21, 22 and 29 as shown in FIGURE 3, it will be evident that these can be replaced by three resistors *r*, 21' and 29', as shown in FIGURE 4, by use of the well known star-delta transformation, their values being thus determined in terms of the values of the resistors 21, 22 and 29. The resistors 15 and *r* of FIGURE 4 are then, however, in parallel, and may thus be replaced by a single resistor 15', to give the equivalent circuit shown in FIGURE 5, the values of the resistors 15', 21' and 29' being determined in terms of the values of the resistors 15, 21, 22 and 29 of FIGURE 2. For the values of these resistors given in the table above, the equivalent values for the equivalent circuit shown in FIGURE 5 are approximately:

15'—13.5K ohms 21'—2.7K ohms 29'—39K ohms.

It will be appreciated that in exactly the same manner the four resistors 15, 21, 22 and 29 in FIGURE 6 can be replaced by an equivalent three-resistor network.

It should be understood that the specific circuit apparatus herein illustrated and described is intended to be representative only, as many changes may be made therein without departing from the clear teachings of the invention. Accordingly, reference should be made to the following claim in determining the full scope of the invention.

What I claim is:

A transistor amplifier comprising two supply-voltage terminals, first, second, third and fourth transistors, means for applying an input signal to the emitter of the first transistor, means for deriving an output signal from the emitter of the fourth transistor, the base of the fourth transistor being connected d.c.-conductively to the collector of the third transistor, the base of the third transistor being connected d.c.-conductively to the emitter of the second transistor, the base of the second transistor being connected d.c.-conductively to the collector of the first transistor, the collectors of the first and third transistors being connected through respective collector load resistances to one of the supply-voltage terminals, the collectors of the second and fourth transistors being each connected directly to said one of the supply-voltage terminals, the emitter of each transistor being connected through a respective emitter resistance to the other supply-voltage terminal, means for determining the base-collector voltage bias of the first transistor solely consisting of a first D.C. conductive path connected between the base of the first transistor and a point on the emitter resistance of the third transistor, and second means for determining the sum of the base-collector voltage biases of the first transistor and of the third transistor solely consisting of a second D.C. conductive path connected between the emitter of the first transistor and a point on the emitter resistance of the fourth transistor, the base of the first transistor having no other external connections influencing the bias of the first transistor.

References Cited in the file of this patent

UNITED STATES PATENTS

| | | |
|---|---|---|
| 2,901,556 | Chapman | Aug. 25, 1959 |
| 2,959,741 | Murray | Nov. 8, 1960 |
| 3,005,958 | Grant | Oct. 24, 1961 |

OTHER REFERENCES

Murray: "Transistor Bias Stabilization," May 1957, pages 161–165, Electronic and Radio Engineer.